US 6,466,095 B1

(12) United States Patent
Suzuki

(10) Patent No.: US 6,466,095 B1
(45) Date of Patent: Oct. 15, 2002

(54) POWER AMPLIFIER

(75) Inventor: Yasuyuki Suzuki, Tokyo (JP)

(73) Assignee: NEC Corporation (JP)

( * ) Notice: Subject to any disclaimer, the term of this patent is extended or adjusted under 35 U.S.C. 154(b) by 0 days.

(21) Appl. No.: 09/674,065

(22) PCT Filed: Jul. 2, 1999

(86) PCT No.: PCT/JP99/03591

§ 371 (c)(1),
(2), (4) Date: Oct. 25, 2000

(87) PCT Pub. No.: WO00/02306

PCT Pub. Date: Jan. 13, 2000

(30) Foreign Application Priority Data

Jul. 6, 1998 (JP) .......................................... 10-190379

(51) Int. Cl.⁷ ................................................ H03F 1/22
(52) U.S. Cl. ........................................ 330/311; 330/302
(58) Field of Search ............................... 330/302, 310, 330/311

(56) References Cited

U.S. PATENT DOCUMENTS

| | | | | |
|---|---|---|---|---|
| 4,041,412 A | * | 8/1977 | Malone ........................ | 331/10 |
| 4,119,923 A | * | 10/1978 | Legendre et al. ............ | 330/284 |
| 4,658,220 A | * | 4/1987 | Heston et al. ................ | 330/277 |
| 5,926,069 A | * | 7/1999 | Ko et al. ..................... | 330/302 |
| 5,966,051 A | * | 10/1999 | Grifftih et al. .............. | 330/285 |
| 6,028,487 A | * | 2/2000 | Kakuta ........................ | 330/311 |

FOREIGN PATENT DOCUMENTS

| | | |
|---|---|---|
| JP | 57-160213 | 10/1982 |
| JP | 5-145349 | 6/1993 |
| JP | 5-308233 | 11/1993 |
| JP | 6-224647 | 8/1994 |
| JP | 7-245529 | 9/1995 |
| JP | 8-65057 | 3/1996 |
| JP | 9-148852 | 6/1997 |

\* cited by examiner

*Primary Examiner*—Benny Lee
*Assistant Examiner*—Henry Choe
(74) *Attorney, Agent, or Firm*—Ostrolenk, Faber, Gerb & Soffen, LLP

(57) ABSTRACT

To provide a variable gain power amplifier with wide dynamic range of transmission power, wherein power efficiency is high, distortion in the linearity is low. In an amplifier with a plurality of transistors connected with cascade, the source of transistor (103) is grounded, the gate of transistor (108) of an output stage is grounded. Further, source bias terminal (109) and drain bias terminal (110) is provided for applying prescribed voltages to the source and drain of transistor (108) of the output stage, respectively. The electric power inputted into transistor (108) of the output stage is passed through without being amplified by applying the prescribed voltages to source bias terminal (109) and drain bias terminal (110), respectively, when the electric power outputted from the output stage is made smaller than a prescribed threshold.

6 Claims, 8 Drawing Sheets

POWER AMPLIFIER

TECHNICAL FIELD

The present invention relates to a power amplifier which amplifies UHF, micro wave and millimeter wave signals with a wide dynamic range.

BACKGROUND ART

Recently, there is an increasing demand for power amplifiers as one of the key device of pocket telephone in a mobile communication system. A high gain, high output power, and high efficiency are required for such a power amplifier.

FIG. 12 is a block diagram of one of the examples of conventional power amplifiers. As shown in FIG. 12, FET 403 and FET 408 are connected in cascade with their sources grounded. The gates of FETs 403 and 408 are connected both with input matching circuits 402 and 407 and with gate bias terminals 404 and 409, respectively, while the drains of FETs 403 and 408 are connected both with draun bias terminals 405 and 410 and with output matching circuits 406 and 411, respectively. Further, the drain of FET 403 is connected with the gate of FET 408 through output matching circuit 406 and input matching circuit 407.

Further, in order to improve a spectral efficiency of the pocket telephones, code division multiple access (CDMA) using spread spectrum is being put into practical use. It is required in the CDMA that transmission output power be controlled within 80 dB to cope with the near-far problem, and that an envelope be detected precisely. Accordingly, the linearity of the amplifier for CDMA should be more strictly guaranteed than the conventional amplifiers.

FIG. 13 is a block diagram of one of the conventional transmission output power controller. The conventional power controller as shown in FIG. 13, which controls the power inputted into power amplifier 416 by using variable gain amplifier 415, comprises radio frequency signal generator 413, modulator 414 for modulating the output from radio frequency signal generator 413, power amplifier 416 for amplifying the output from modulator 414, variable gain amplifier 415 for controlling power amplifier 416, antenna duplexer, and antenna 418.

As mentioned above, the amplifier for CDMA should be a low distortion, high power, and linear amplifier.

However, the conventional amplifiers have a disadvantage that the electric power is consumed vainly, because the power efficiency by the combination of the variable gain amplifier and the power amplifier is much smaller for the minimum power input than for the maximum power input.

Therefore, an object of the present invention is to provide a power amplifier with high power efficiency, low distortion, and variable gain in wide dynamic range.

DISCLOSURE OF THE INVENTION

To solve the above mentioned problems, the power amplifier of the present invention comprises an input stage including one or more FETs with grounded sources, and an output stage including one or more FETs with grounded gates. Further, a plurality of bias terminals are connected with the sources and drains of the transistors in the output stage. When the output power is made smaller than a prescribed threshold, the power inputted into the output stage is allowed to go through without being amplified from the output terminal of the output stage, by applying a control voltage to the bias terminals.

Another power amplifier of the present invention comprises an input stage including one or more bipolar transistors with grounded emitters, and an output stage including one or more bipolar transistors with grounded bases. Further, a plurality of bias terminals are connected with the sources and drains of the transistors in the output stage. When the output power is smaller than a prescribed threshold, the power inputted into the output stage is allowed to go through without being amplified from the output terminal of the output stage, by applying a control voltage to the bias terminals.

Still another power amplifier of the present invention comprises a plurality of transistors, at least two of which are FETs with grounded gates. Further, a plurality of bias terminals are connected with the sources and drains of the FETs with grounded gates. When the output power is smaller than a prescribed threshold, the power inputted into at least one of the FETs with grounded gates is allowed to go through without being amplified, by applying a control voltage to the bias terminal.

Other power amplifier of the present invention comprises a plurality of transistors, at least two of which are bipolar transistors with grounded bases. Further, a plurality of bias terminals are connected with the emitters and collectors of the bipolar transistors with grounded bases. When the output power is smaller than a prescribed threshold, the power inputted into at least one of the bipolar transistors with grounded bases is allowed to go through without being amplified, by applying a control voltage to the bias terminal.

Further, one or more FETs with grounded gates in the input stage as mentioned-above may be connected with one or more first input-output matching circuits which allows the linear gain of the input stage to be greater than that of the output stage, while one or more FETs with grounded gates in the output stage as mentioned-above may be connected with one or more second input-output matching circuits which allows the output power from the output stage to be greater than that of the input stage.

Further, one or more bipolar transistors with grounded bases in the input stage as mentioned-above may be connected with one or more first input-output matching circuits which allows the linear gain of the input stage to be greater than that of the output stage, while one or more bipolar transistors with grounded bases in the output stage as mentioned-above may be connected with one or more second input-output matching circuits which allows the output power from the output stage to be greater than that of the input stage.

In short, the input power into at least one of the transistors of the power amplifier of the present invention is passed through without amplification, when the output power of the power amplifier of the present invention is made smaller than a prescribed threshold. Therefore, the power efficiency becomes high, even when the transmission power is small.

THE BEST MODE FOR CARRYING OUT THE INVENTION

Figure 1:
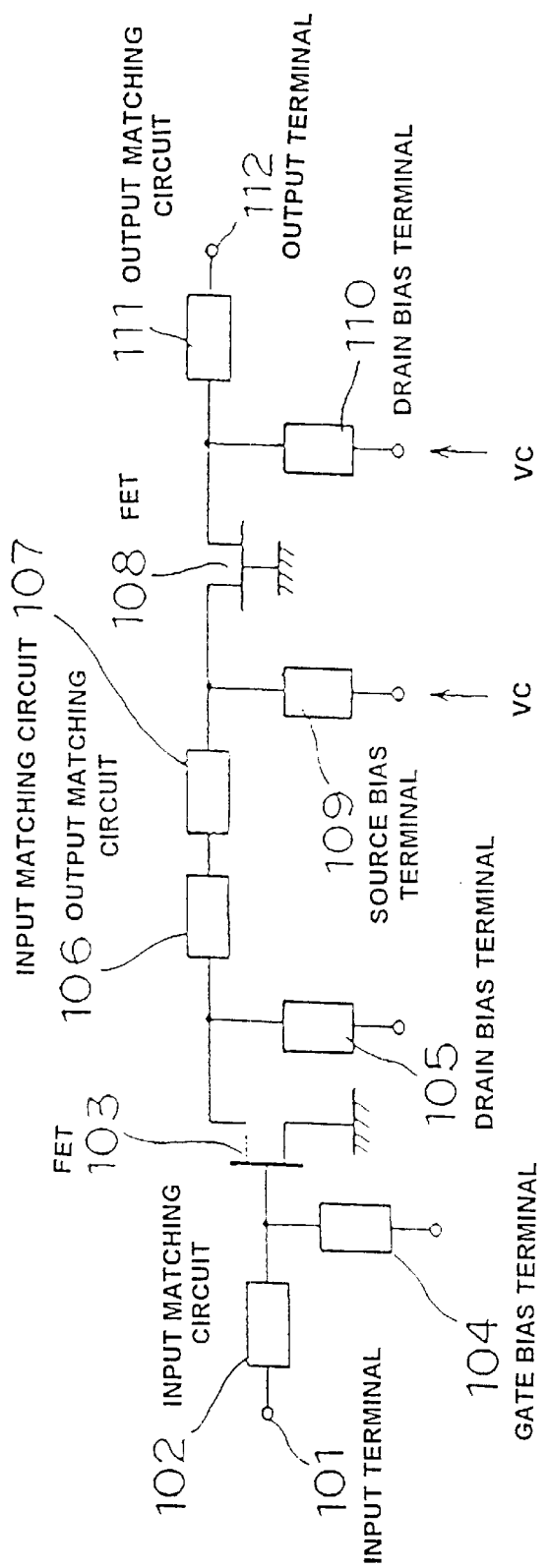
FIG. 1 is a block diagram of a power amplifier of the first mode of embodiment of the present invention.

In the following, the modes of embodiment of the present invention are explained, referring to the drawings.

(First Mode of Embodiment)

FIG. 1 is a block diagram of the power amplifier of the first mode of embodiment of the present invention. As shown in FIG. 1, FET 103 with grounded source is connected in cascade with FET 108 with grounded gate. The gate of FET 103 is connected with both of input matching circuit 102 and gate bias terminal 104, while the drain of FET 103 is connected with both of drain bias terminal 105 and output matching circuit 106. The source of FET 108 is connected with both of input matching circuit 107 and source bias terminal 109, while the drain of FET 108 is connected with both of drain bias terminal 110 and output matching circuit 111. Further, the drain of FET 103 is connected through output matching circuit 106 and input matching circuit 107 with the source of FET 108.

In the following, the operation of the amplifier of the first mode of embodiment is explained.

Figure 2:
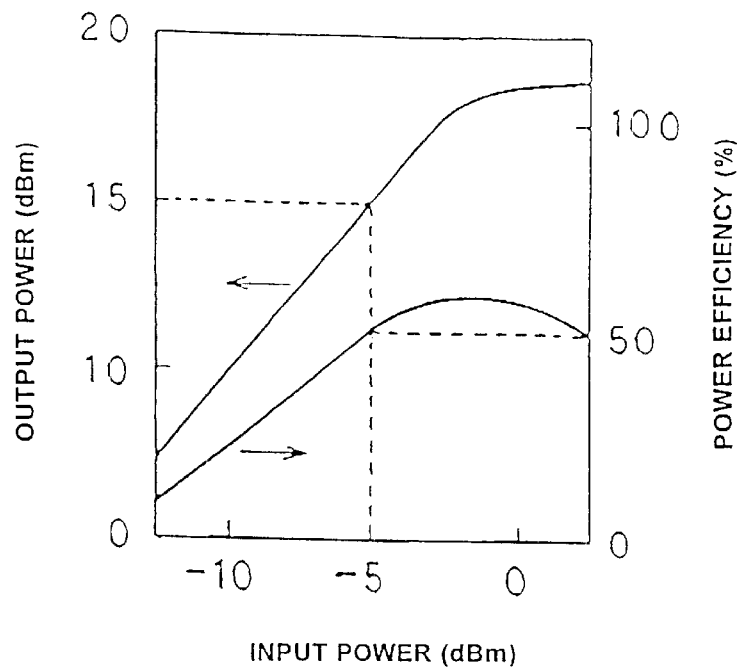
FIG. 2 is a graph indicating an input-output relation and power efficiency of the input stage FET as shown in FIG. 1.

FIG. 2 is a graph indicating input-output characteristic and power efficiency of FET 103 at 950 MHz. In the linear amplification region of FET 103 as shown in FIG. 2, 15 dBm output power and 50% power efficiency are obtained for −5 dBm input power.

Figure 3:
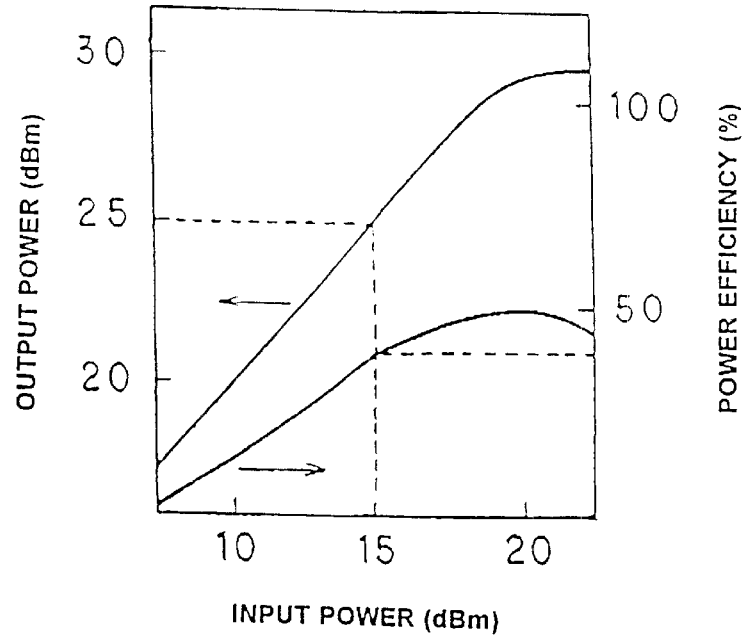
FIG. 3 is a graph indicating an input-output relation and power efficiency of the output stage FET as shown in FIG. 1.

FIG. 3 is a graph indicating input-output characteristic and power efficiency of FET 108 as shown in FIG. 1 of which gate is five times wider than that of FET 103 to output greater power. In the linear amplification region of FET 108 as shown in FIG. 3, 25 dBm output power and 40% power efficiency are obtained for 15 dBm input power.

By using FET 103 and FET 108 of which characteristics are shown in FIGS. 2 and 3, respectively, 25 dBm output power and 40% power efficiency are obtained for 0 dBm input power. Here, in FET 103, the gate bias voltage is, for example, −1 V and the drain bias voltage is, for example, 5 V. Further, in FET 108, the gate bias voltage is, for example, 0 V, the source bias voltage is, for example, −1 V, and the drain bias voltage is, for example, 5 V, although biasing voltages of FET 108 may be arbitrary, when the gate of FET 108 is AC grounded in the operating frequency.

On the other hand, the input power goes through FET 108 without being amplified, when the source voltage and the drain voltage become, for example, 0 V, if variable gain control voltage VC is applied to source bias terminal 109 and drain bias terminal 110 in order to operate the amplifier of the present invention in a smaller output region, for example, 0 dBm output power.

Figure 4:
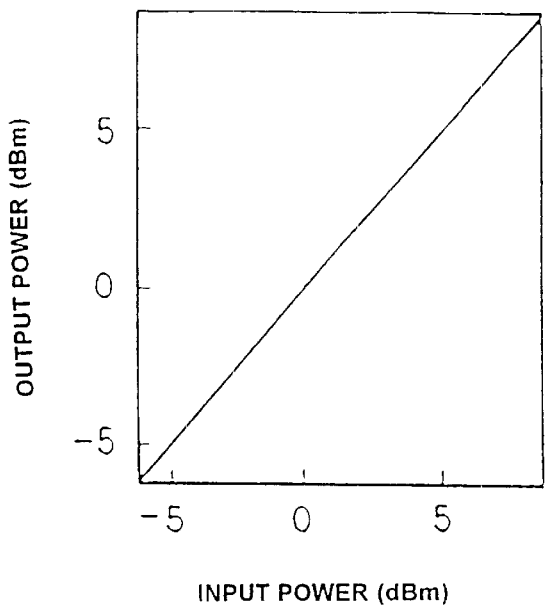
FIG. 4 is a graph indicating an input-output relation, when the transmission output power is small in the output stage FET as shown in FIG. 1.

FIG. 4 is a graph indicating the input-output relation of FET 108 in a smaller output power region. As shown in FIG. 4, 0 dBm output power is obtained for 0 dBm input power. When −20 dBm is inputted into FET 103, the output from FET 108 becomes 0 dBm, and total power efficiency becomes 30% which depends only upon FET 103.

Thus, the input power passes through FET 108 without amplification, when variable gain control voltage VC is applied to source bias terminal 109 and drain bias terminal 110 in a smaller output region of the amplifier of the present invention. Thus, the amplifier of the present invention operates under a higher power efficiency.

More than 2 transistors may be employed, although only two transistors 103 and 108 are illustrated in FIG. 1.

(Second Mode of Embodiment)

Bipolar transistors are employed in place of FETs 103 and 108 as shown in FIG. 1.

Figure 5:
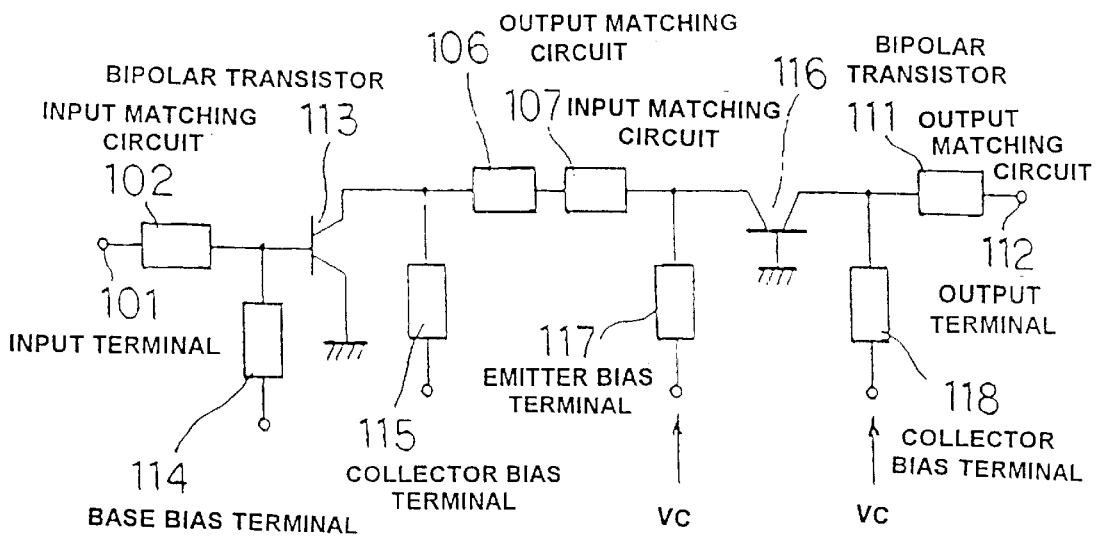
FIG. 5 is a block diagram of a power amplifier of the second mode of embodiment of the present invention.

FIG. 5 is a block diagram of the second mode of embodiment of the present invention. As shown in FIG. 5, bipolar transistor 113 with grounded emitter is connected in cascade with bipolar transistor 116 with grounded base. The base of bipolar transistor 113 is connected with both of input matching circuit 102 and base bias terminal 114, while the collector of bipolar transistor 113 is connected with both of collector bias terminal 115 and output matching circuit 106. The emitter of bipolar transistor 116 is connected with both of input matching circuit 107 and emitter bias terminal 117, while the collector of bipolar transistor 116 is connected with both of collector bias terminal 118 and output matching circuit 111. Further, the collector of bipolar transistor 113 is connected through output matching circuit 106 and input matching circuit 107 with the emitter of bipolar transistor 116.

The input power goes through bipolar transistor 116 without being amplified, when variable gain control voltage VC is applied to emitter bias terminal 117 and collector bias terminal 118 in a smaller output region of the amplifier of the present invention. Thus, the amplifier of the present invention operates under a higher power efficiency.

(Third Mode of Embodiment)

Figure 6:
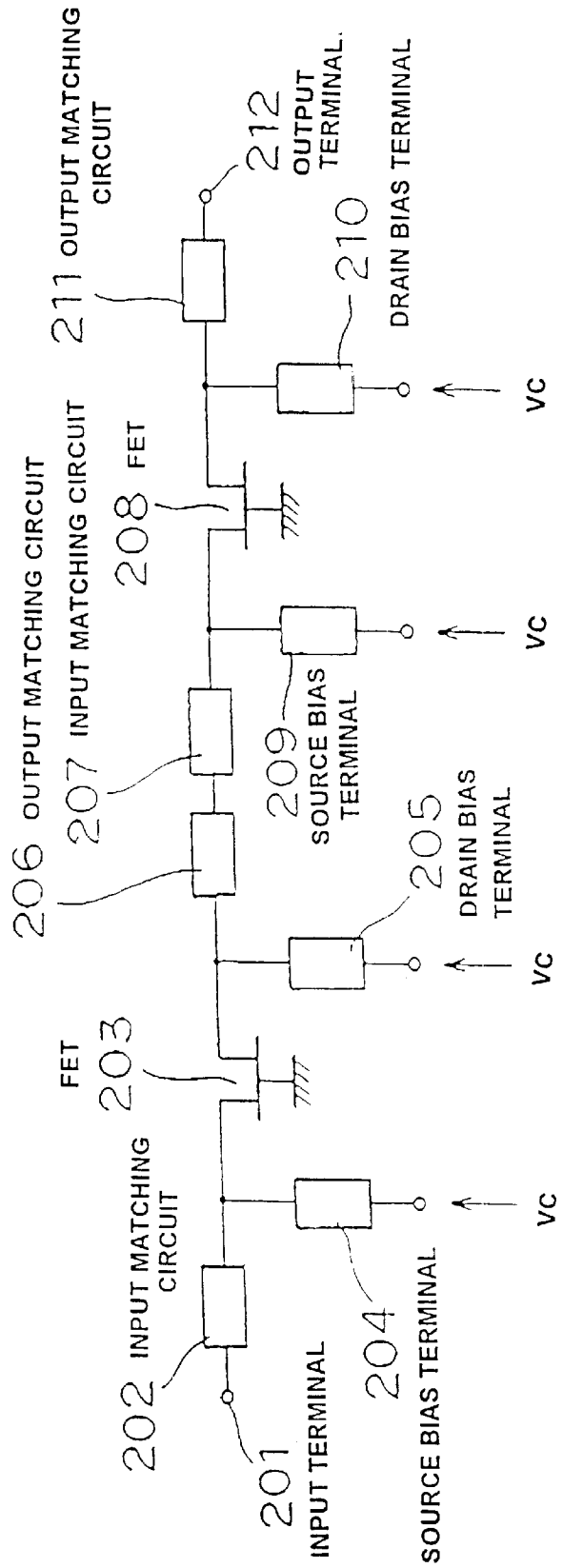
FIG. 6 is a block diagram of a power amplifier of the third mode of embodiment of the present invention.

FIG. 6 is a block diagram of the third mode of embodiment of the present invention. As shown in FIG. 6, FET 203 with grounded gate is connected in cascade with FET 208 with grounded gate. The source of FET 203 is connected with both of input matching circuit 202 and source bias terminal 204, while the drain of FET 203 is connected with both of drain bias terminal 205 and output matching circuit 206. The source of FET 208 is connected with both of input matching circuit 207 and source bias terminal 209, while the drain of FET 208 is connected with both of drain bias terminal 210 and output matching circuit 211. Further, the drain of FET 203 is connected through output matching circuit 206 and input matching circuit 207 with the source of FET 208. In the following, the operation of the amplifier of the third mode of embodiment is explained.

Figure 7:
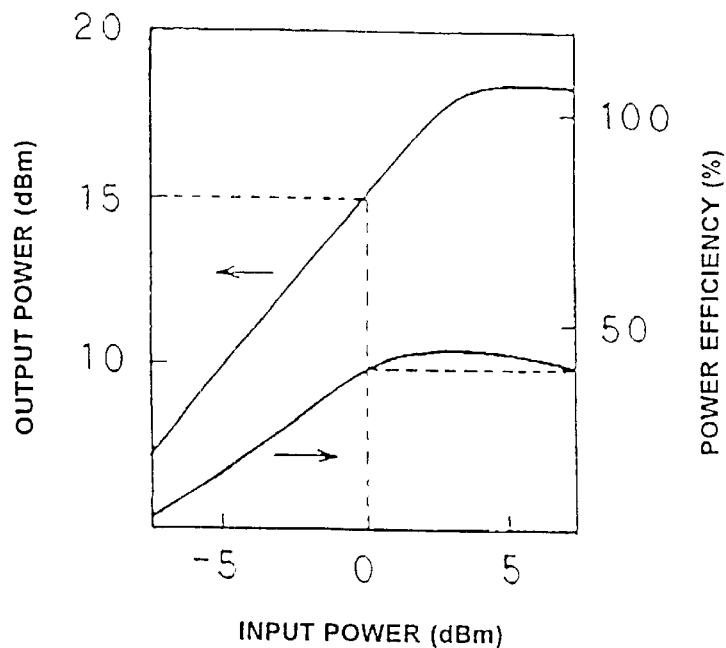
FIG. 7 is a graph indicating an input-output relation and power efficiency of the input stage FET as shown in FIG. 6.

FIG. 7 is a graph indicating input-output characteristics and power efficiency of FET 203 as shown in FIG. 6 at 950 MHz. In the linear amplification region of FET 203 as shown in FIG. 7, 15 dBm output power and 40% power efficiency are obtained for −5 dBm input power.

Figure 8:
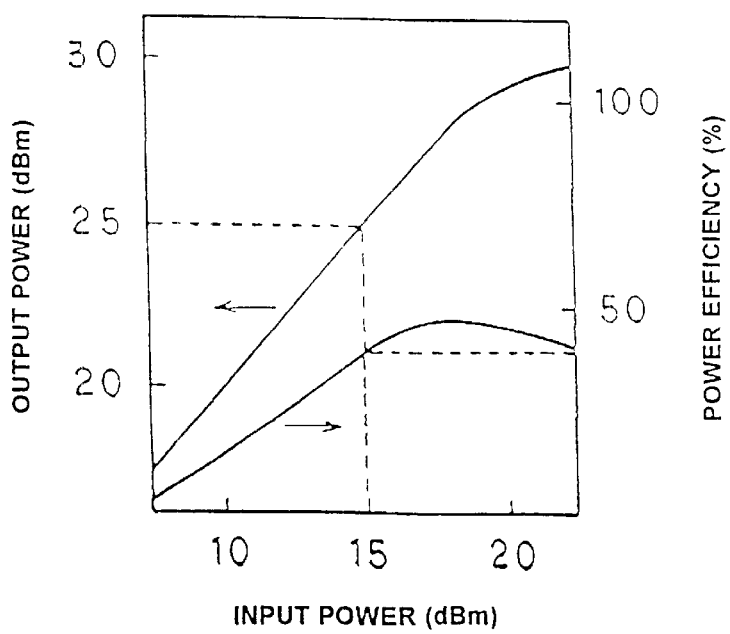
FIG. 8 is a graph indicating an input-output relation and power efficiency of the output stage FET as shown in FIG. 6.

FIG. 8 is a graph indicating input-output characteristics and power efficiency of FET 208 as shown in FIG. 6 of which gate is five times wider than that of FET 203 to output greater power. In the linear amplification region of FET 208, 25 dBm output power and 40% power efficiency are obtained for 15 dBm input power, as shown in FIG. 8.

By connecting, in the manner as shown in FIG. 6, FET 203 with FET 208 of which characteristics are shown in FIGS. 7 and 8 respectively, 25 dBm output power and 40% power efficiency are obtained for 0 dBm input power. Here, in FETs 203 and 208, the gate bias voltage is, for example, 0 V, the source bias voltage is, for example, −1 V and the drain bias voltage is, for example, 5 V.

On the other hand, the input power goes through FET 208 without being amplified, when the source voltage and the drain voltage become, for example, 0 V, if variable gain control voltage VC is applied to source bias terminal 209 and drain bias terminal 210 in order to operate the amplifier of the present invention in a smaller output region, for example, 0 dBm output power.

The input-output characteristic of FET 208 in a small output region is similar to that as shown in FIG. 4. 0 dBm output power is obtained for 0 dBm input power. When −15 dBm is inputted into FET 203, the output from FET 208 becomes 0 dBm, and total power efficiency becomes 30% which depends only upon FET 203. Further, the power inputted into FET 203 goes through FET 208 without being amplified, when variable gain control voltage VC is applied to source bias terminal 209 and drain bias terminal 210 in a smaller output region of the amplifier of the present invention. Therefore, the power consumed by the amplifier of the present invention is very small in the small input-output region.

Thus, the input power goes through FET 208 without being amplified, when variable gain control voltage VC is applied to source bias terminal 209 and drain bias terminal 210 in a smaller output region of the amplifier of the present invention. Thus, the amplifier of the present invention operates under a higher power efficiency.

More than 2 transistors may be employed, although only two transistors 203 and 208 are illustrated in FIG. 6.

(Forth Mode of Embodiment)

Bipolar transistors are employed in place of FETs 203 and 208 as shown in FIG. 6.

Figure 9:
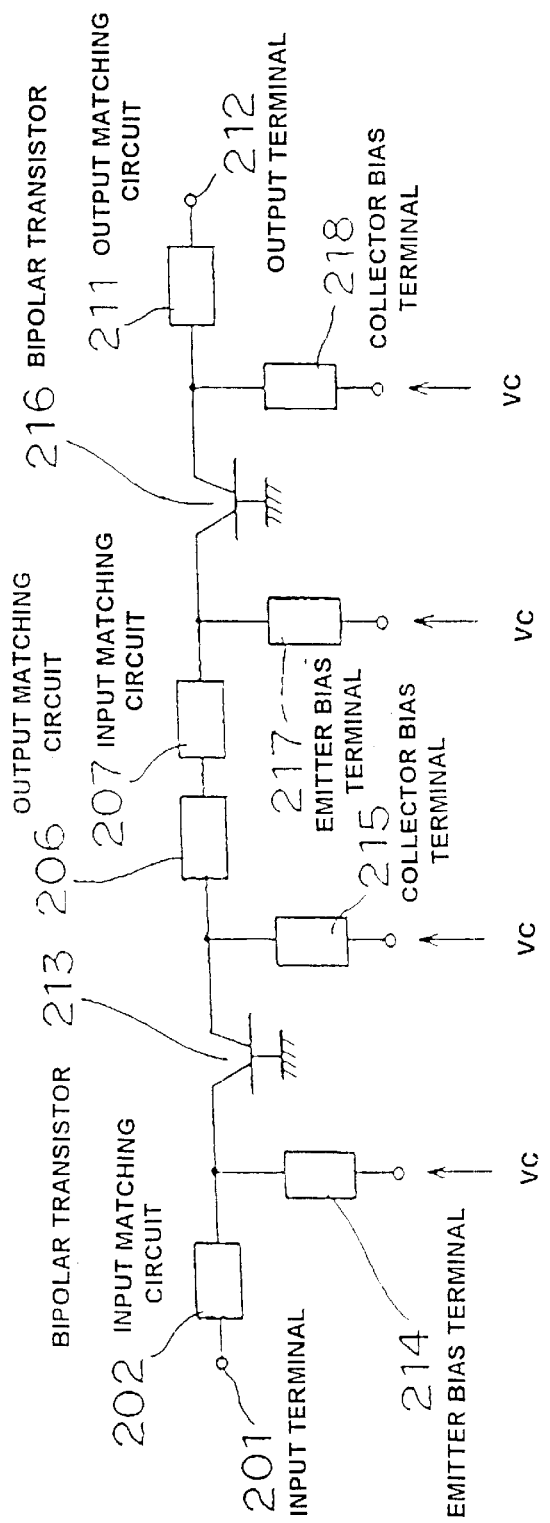
FIG. 9 is a block diagram of a power amplifier of the forth mode of embodiment of the present invention.

FIG. 9 is a block diagram of the forth mode of embodiment of the present invention. As shown in FIG. 9, bipolar transistor 213 with grounded base is connected in cascade with bipolar transistor 216 with grounded base. The emitter of bipolar transistor 213 is connected with both of input matching circuit 202 and emitter bias terminal 214, while the collector of bipolar transistor 213 is connected with both of collector bias terminal 215 and output matching circuit 206. The emitter of bipolar transistor 216 is connected with both of input matching circuit 207 and emitter bias terminal 217, while the collector of bipolar transistor 216 is connected with both of collector bias terminal 218 and output matching circuit 211. Further, the collector of bipolar transistor 213 is connected through output matching circuit 206 and input matching circuit 207 with the emitter of bipolar transistor 216.

The input power goes through bipolar transistor 216 without being amplified, when variable gain control voltage VC is applied to emitter bias terminal 217 and collector bias terminal 218 in a smaller output region of the amplifier of the present invention. Thus, the amplifier of the present invention operates under a higher power efficiency.

(Fifth Mode of Embodiment)

The power amplifier of the fifth mode of embodiment is explained, wherein the gate widths of FETs 203 and 208 as shown in FIG. 6 are almost the same.

The power amplifier of the fifth mode of embodiment comprises a first amplifier and a second amplifier, wherein the first amplifier is connected with the first input-output matching circuit which allows the linear gain of the first amplifier to be greater than that of the second amplifier, while the second amplifier is connected with the second input-output matching circuit which allows the output power from the second amplifier to be greater than that of the first amplifier.

Figure 10:
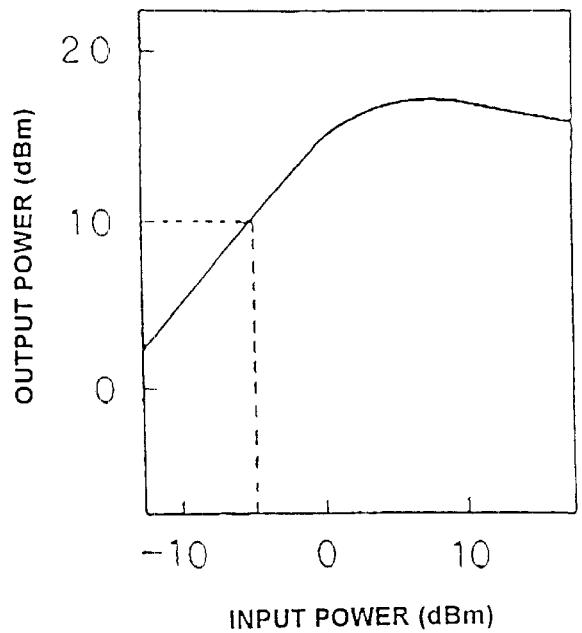
FIG. 10 is a graph indicating an example of the input-output relation of the input stage FET.

FIG. 10 is a graph indicating an example of the input-output characteristic of the first amplifier at 950 MHz.

Figure 11:
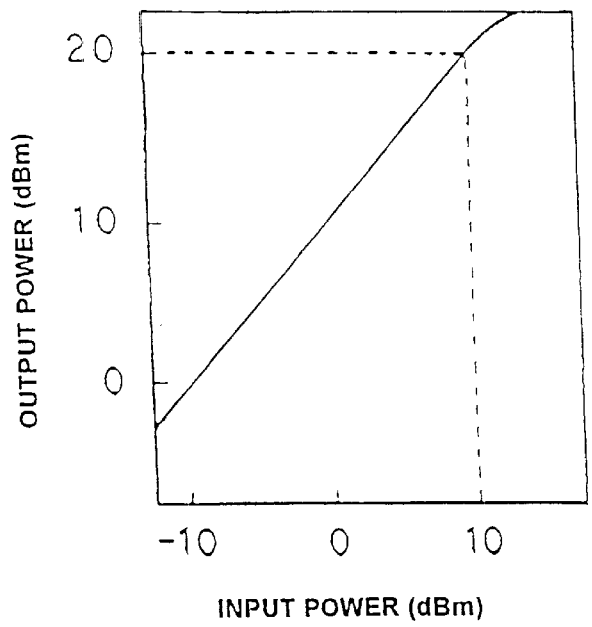
FIG. 11 is a graph indicating an example of the input-output relation of the output stage FET.
Figure 12:
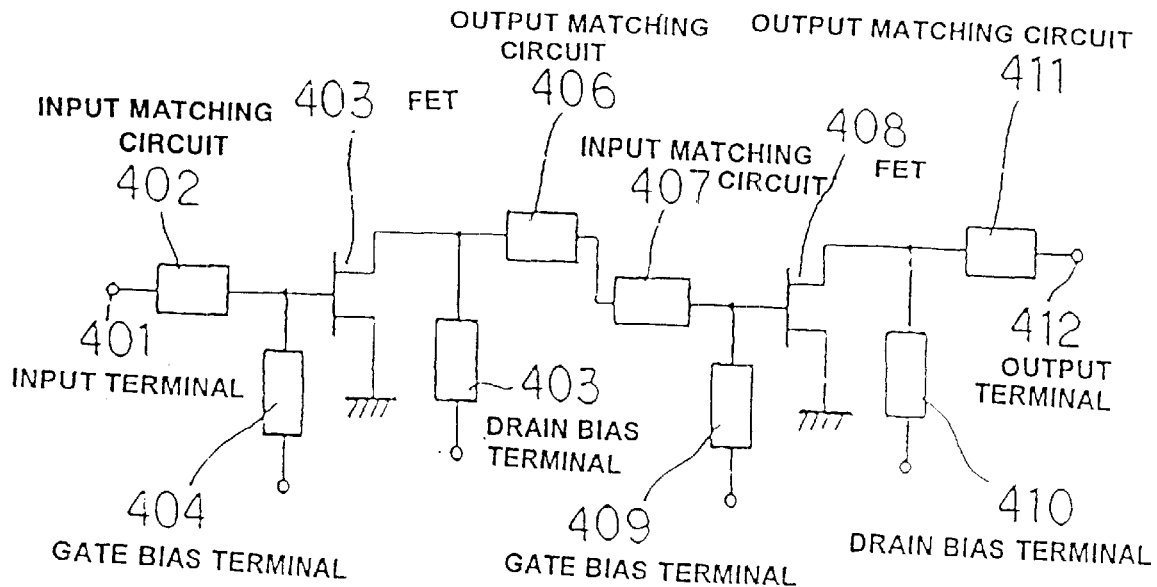
FIG. 12 is a block diagram of one of the conventional power amplifiers.
Figure 13:
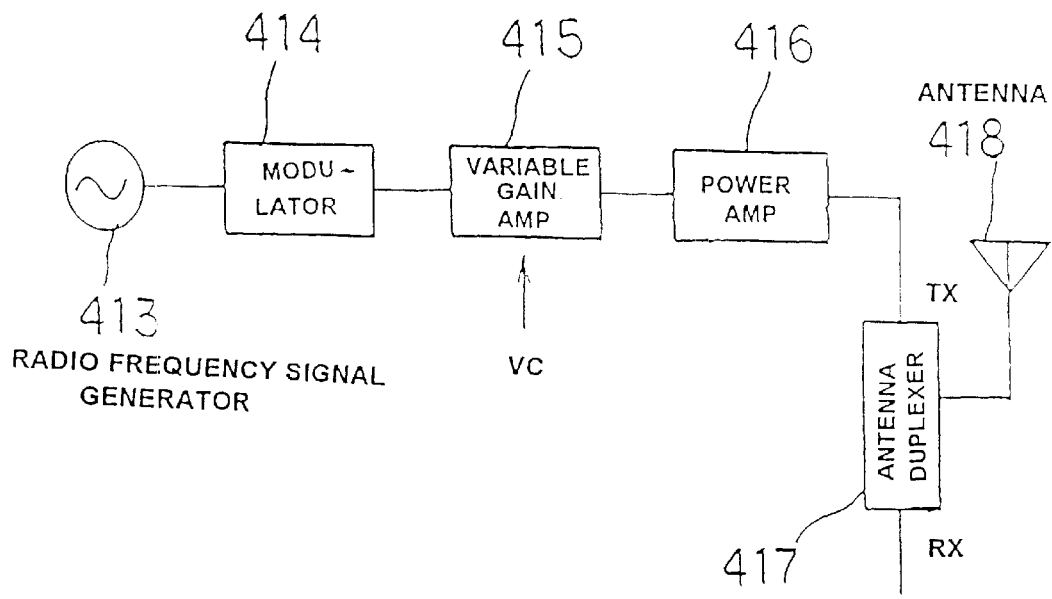
FIG. 13 is a block diagram of one of the conventional circuit for transmitting variable power output wave.

FIG. 11 is a graph indicating an example of the input-output characteristic of the second amplifier.

As shown in FIG. 10, the first amplifier has a linear gain 15 dB, which is greater than that of the second amplifier, for −5 dBm input and can output 10 dBm output power.

However, the output from the first amplifier saturates at the input power 10 dBm.

On the other hand, the second amplifier maintains the linearity even at the input power 10 dBm and can output 20 dBm output power which is greater than that of the first amplifier.

As explained above, the FETs with grounded gates in the fifth mode of embodiment have different, although their sizes are the same. These FETs are connected with each other, in the manner as shown in FIG. 6. The source and drain of these FETs with grounded gates in the input stage and output stage are controlled by variable gain control voltage VC.

For example, when the source bias voltage and the drain bias voltage of the first amplifier provided in place of FET 203 become 0 V, the power inputted into the first amplifier goes through without being amplified and is transferred to the second amplifier.

Further, for example, when the source bias voltage and the drain bias voltage of the second amplifier provided in place of FET 208 become 0 V, the power inputted into the second amplifier goes through without being amplified.

Thus, the power efficiency and the linearity is optimized for the levels of the input power and the output power.

More than 2 transistors may be employed, although only two transistors are employed in the above-mentioned explanation of the fifth mode of embodiment.

The FETs may be replaced by bipolar transistors with grounded bases, whereby the input power goes through one of the bipolar transistors or both of the bipolar transistors without being amplified, when variable gain control voltage VC is applied to the bipolar transistors in a smaller output region of the amplifier. Thus, the amplifier of the present invention operates under a higher power efficiency.

Industrial Applicability

According to the present invention, a high power efficiency is obtained in a small output power region, because at least one transistor among a plurality of transistors lets the inputted power go through itself without amplifying the inputted power.

Further, according to the present invention, a power amplifier with wide dynamic range of transmission power is provided, wherein power efficiency is high, distortion in the linearity is low, and gain is variable.

What is claimed is:

1. A power amplifier with a plurality of transistors connected in cascade which comprises:
   an input stage including one or more FETs with grounded sources;
   an output stage including one or more FETs with grounded gates; and
   a plurality of bias terminals connected with the sources and drains of said transistors in said output stage,
   which is characterized in that the power inputted into said output stage is allowed to go through without being amplified from the output terminal of said output stage, by applying a control voltage to said bias terminals, when the output power from said output stage is smaller than a prescribed threshold.

2. A power amplifier with a plurality of transistors connected in cascade which comprises:
   an input stage including one or more bipolar transistors with grounded emitters;
   an output stage including one or more bipolar transistors with grounded bases; and
   a plurality of bias terminals connected with the emitters and collectors of said transistors in said output stage,
   which is characterized in that the power inputted into said output stage is allowed to go through without being amplified from the output terminal of said output stage, by applying a control voltage to said bias terminals, when the output power from said output stage is smaller than a prescribed threshold.

3. A power amplifier with a plurality of transistors connected in cascade which comprises:
   at least two FETs with grounded gates; and
   a plurality of bias terminals connected with the sources and drains of said FETs,
   which is characterized in that the power inputted into at least one of said FETs is allowed to go through without being amplified, by applying a control voltage to the bias terminals when the output power from said power amplifier is smaller than a prescribed threshold.

4. A power amplifier with a plurality of transistors connected with cascade which comprises:
   at least two bipolar transistors with grounded bases; and
   a plurality of bias terminals connected with the emitters and collectors of said bipolar transistors,
   characterized in that the power inputted into at least one of said bipolar transistors is allowed to go through without being amplified, by applying a control voltage to said bias terminals, when the output power from said power amplifier is smaller than a prescribed threshold.

5. The power amplifier according to claim 3, wherein which further comprises:
   a first input output matching circuit which is connected with said FET with grounded gate of said input stage, and which makes a linear gain of said FET with grounded gate of said input stage greater than a linear gain of said FET with grounded gate of said output stage; and
   a second input output matching circuit which is connected with said FET with grounded gate of said output stage, and which makes an output power of said FET with grounded gate of said output stage greater than an output power of said FET with grounded gate of said input stage.

6. The power amplifier according to claim 4, wherein which further comprises:
   a first input output matching circuit which is connected with said bipolar transistor with grounded base of said input stage, and which makes a linear gain of said bipolar transistor with grounded base of said input stage greater than a linear gain of said bipolar transistor with grounded base of said output stage; and
   a second input output matching circuit which is connected with said bipolar transistor with grounded base of said output stage, and which makes an output power of said bipolar transistor with grounded base of said output stage greater than an output power of said bipolar transistor with grounded base of said input stage.

* * * * *